United States Patent
Kawasaki et al.

(10) Patent No.: US 11,037,962 B2
(45) Date of Patent: Jun. 15, 2021

(54) THIN-FILM TRANSISTOR ARRAY SUBSTRATE AND DISPLAY DEVICE

(71) Applicant: Sharp Kabushiki Kaisha, Sakai (JP)

(72) Inventors: Tatsuya Kawasaki, Sakai (JP); Hideki Kitagawa, Sakai (JP); Yoshihito Hara, Sakai (JP); Masaki Maeda, Sakai (JP); Toshikatsu Itoh, Sakai (JP); Hajime Imai, Sakai (JP); Tohru Daitoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 29 days.

(21) Appl. No.: 16/628,048

(22) PCT Filed: Jun. 28, 2018

(86) PCT No.: PCT/JP2018/024480
§ 371 (c)(1),
(2) Date: Jan. 2, 2020

(87) PCT Pub. No.: WO2019/009167
PCT Pub. Date: Jan. 10, 2019

(65) Prior Publication Data
US 2021/0143184 A1 May 13, 2021

(30) Foreign Application Priority Data
Jul. 5, 2017 (JP) .............................. JP2017-131938

(51) Int. Cl.
*G02F 1/1333* (2006.01)
*G02F 1/1345* (2006.01)
(Continued)

(52) U.S. Cl.
CPC .......... *H01L 27/124* (2013.01); *G02F 1/1368* (2013.01); *G02F 1/133345* (2013.01); *G02F 1/136286* (2013.01); *G02F 1/13458* (2013.01)

(58) Field of Classification Search
CPC ............... H01L 27/124; H01L 27/3258; H01L 2224/32227; H01L 2224/04026;
(Continued)

(56) References Cited

U.S. PATENT DOCUMENTS 5,589,962 A * 12/1996 Yamamoto ........ G02F 1/136213
349/46
2014/0176886 A1 6/2014 Yoshida

FOREIGN PATENT DOCUMENTS

WO 2013/021866 A1 2/2013

* cited by examiner

*Primary Examiner* — Thoi V Duong
(74) *Attorney, Agent, or Firm* — Keating & Bennett, LLP

(57) ABSTRACT

The present invention provides a thin-film transistor array substrate that prevents semiconductor layers of thin-film transistor elements from having step disconnection even when the frame width is reduced. The thin-film transistor array substrate of the present invention includes a thin-film transistor element in a pixel region and a terminal in a terminal region. The thin-film transistor array substrate sequentially includes a support, an insulating layer, a gate electrode, a gate insulating layer, and a semiconductor layer in a cross-sectional view of the pixel region. A region with the insulating layer encompasses a region with the semiconductor layer in a plan view of the pixel region. The thin-film transistor array substrate sequentially includes the support, a lead line extending from the terminal, and the insulating layer in a cross-sectional view of the terminal region.

5 Claims, 11 Drawing Sheets

(51) Int. Cl.
    *G02F 1/1368*   (2006.01)
    *H01L 27/12*    (2006.01)
    *G02F 1/1362*   (2006.01)
(58) Field of Classification Search
    CPC . H01L 2224/05083; H01L 2224/05084; H01L 23/528; H01L 23/5386; G02F 1/1368; G02F 1/1362; G02F 1/136286; G02F 1/13452; G02F 1/134309; G02F 1/13458; G02F 1/133345; G02F 1/1343; G02F 1/1333; G02F 1/133305; G02F 1/133302; G02F 1/1345
    See application file for complete search history.

(a)

(b)

(c)

(d)

(e)

(f)

(a)

(b)

(c)

(d)

(e)

(f)

(a)

(b)

(c)

(d)

(e)

(f)

(a)

(b)

(c)

(d)

(e)

(f)

Step disconnection

THIN-FILM TRANSISTOR ARRAY SUBSTRATE AND DISPLAY DEVICE

TECHNICAL FIELD

The present invention relates to thin-film transistor array substrates and display devices. The present invention specifically relates to a thin-film transistor array substrate including a thin-film transistor element and a display device including the thin-film transistor array substrate.

BACKGROUND ART

Thin-film transistor array substrates are used for electrical control of display devices such as liquid crystal display devices in variety of applications such as televisions, smartphones, tablet terminals, personal computers, and automotive navigation systems (e.g., Patent Literature 1).

CITATION LIST

Patent Literature
Patent Literature 1: WO 2013/021866

SUMMARY OF INVENTION

Recently, display devices have been demanded to increase a display region that provides images and to reduce a frame region that does not contribute to image display, i.e., to achieve frame reduction. Unfortunately, the frame region includes terminals connected to external circuit(s) and lead lines extending from the terminals and electrically connected to lines in the display region. Keeping the region for disposing these members may inhibit frame reduction.

In response to this issue, the present inventors studied a structure in which the lead lines are disposed in an electrode layer including members constituting thin-film transistor elements, such as gate electrodes and source electrodes, and also below the layer including the gate electrodes via an insulating layer. This study revealed that this structure achieves efficient arrangement of the lead lines in the frame region. Still, in order to achieve a better transmittance, the insulating layer had better be removed in the display region on the lower layer side of the layer including the gate electrodes.

The present inventors thus studied removing the insulating layer in the display region on the lower layer side (support side) of the gate electrodes. Unfortunately, when the insulating layer is removed by a method such as dry etching, dust generated during etching masks the insulating layer, whereby the insulating layer partly remains without being completely removed. When the gate electrodes, the gate insulating layer, and the semiconductor layers are sequentially stacked in the state with the residual insulating layer, the level difference caused by the insulating layer triggers step disconnection of the semiconductor layer, resulting in display defect.

FIG. 12 is a schematic cross-sectional view illustrating a state of step disconnection of a semiconductor layer. As shown in FIG. 12, a thin-film transistor array substrate 102 in a cross-sectional view of a display region sequentially includes a support 108, a residual insulating layer 121, which remains without being removed on a surface of the support 108, and a thin-film transistor element 113. Each thin-film transistor element 113 has a laminate structure sequentially including, from the insulating layer 121 side, a gate electrode 116, a gate insulating layer 117, a semiconductor layer 118, and a source electrode 119 (drain electrode 120). Such a laminate structure tends to cause each of the gate electrode 116, the gate insulating layer 117, and the semiconductor layer 118 to have a great level difference on the surface thereof due to a level difference caused by the residual insulating layer 121, which remains without being removed. Especially, the semiconductor layer 118 having a small thickness may have step disconnection as shown in FIG. 12.

As described, conventional thin-film transistor array substrates have an issue for preventing the semiconductor layer of each thin-film transistor element from having step disconnection when the frame width is reduced. The way to achieve this issue has not been found. For example, Patent Literature 1 fails to discuss step disconnection of the semiconductor layer of a thin-film transistor element. Thus, there is still room for improvement.

The present invention has been made under the current situation in the art and aims to provide a thin-film transistor array substrate that prevents semiconductor layers of thin-film transistor elements from having step disconnection even when the frame width is reduced, and a display device including the thin-film transistor array substrate.

Solution to Problem

The present inventors made studies on a thin-film transistor array substrate that prevents semiconductor layers of thin-film transistor elements from having step disconnection even when the frame width is reduced and a display device including the thin-film transistor array substrate. Then, they found that step disconnection of the semiconductor layers is prevented when, in the display region, an insulating layer on the lower layer side (support side) of gate electrodes is allowed to remain without being removed by a method such as dry etching and is disposed so as to encompass regions with the semiconductor layers in a plan view. Thereby, the inventors successfully completed the above issue, completing the present invention.

In other words, an aspect of the present invention may be a thin-film transistor array substrate including a thin-film transistor element in a pixel region and a terminal in a terminal region, the thin-film transistor array substrate sequentially including a support, an insulating layer, a gate electrode, a gate insulating layer, and a semiconductor layer in a cross-sectional view of the pixel region, a region with the insulating layer encompassing a region with the semiconductor layer in a plan view of the pixel region, the thin-film transistor array substrate sequentially including the support, a lead line extending from the terminal, and the insulating layer in a cross-sectional view of the terminal region.

In an embodiment of the present invention, the insulating layer may be in contact with the support in a cross-sectional view of the pixel region, and the lead line may be in contact with the support in a cross-sectional view of the terminal region.

In an embodiment of the present invention, the thin-film transistor array substrate may further include, in a cross-sectional view of the pixel region, a conductive layer that is present between the support and the insulating layer, formed from a conductive material of the lead line, and in contact with the support, and the lead line may be in contact with the support in a cross-sectional view of the terminal region.

Another aspect of the present invention may be a display device including the thin-film transistor array substrate.

In another aspect of the present invention, the display device may be a liquid crystal display device.

Advantageous Effects of Invention

The present invention can provide a thin-film transistor array substrate that prevents semiconductor layers of thin-film transistor elements from having step disconnection even when the frame width is reduced, and a display device including the thin-film transistor array substrate.

DESCRIPTION OF EMBODIMENTS

The present invention is described below in more detail based on embodiments with reference to the drawings. The embodiments, however, are not intended to limit the scope of the present invention. The configurations employed in the embodiments may appropriately be combined or modified within the spirit of the present invention.

The following embodiments give cases where a thin-film transistor array substrate of the present invention is applied to a liquid crystal display device. The thin-film transistor array substrate of the present invention is applicable to any type of the display device, and may be applied to organic electroluminescent display devices in addition to liquid crystal display devices.

Embodiment 1

Figure 1:
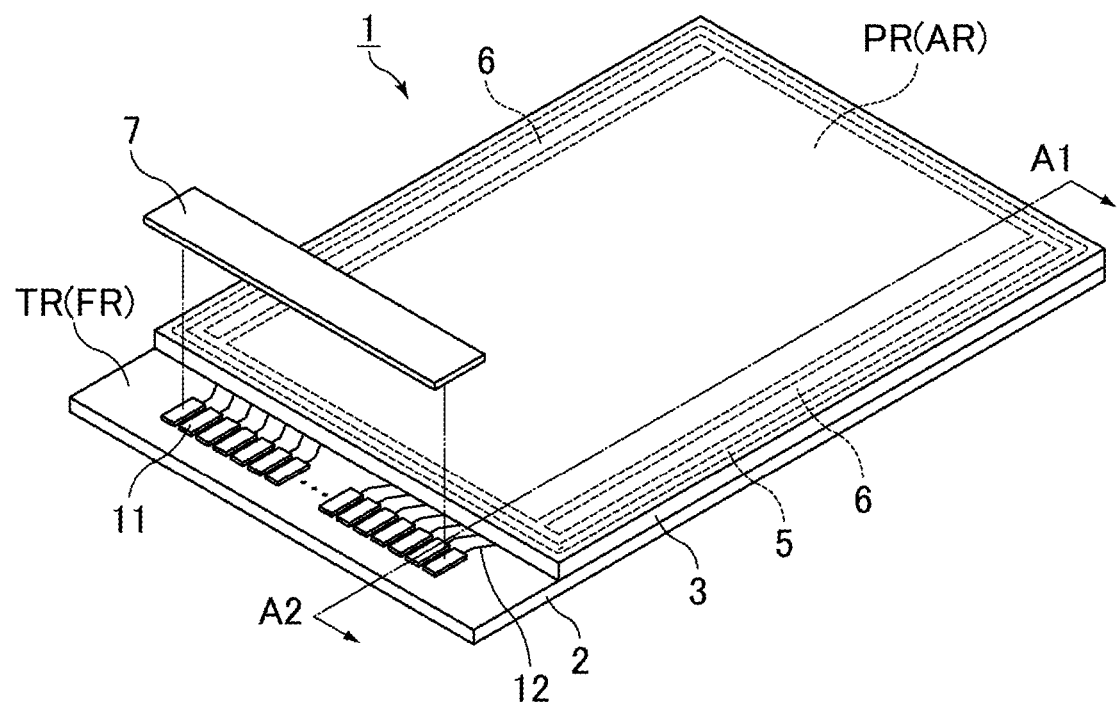
FIG. 1 is a schematic perspective view of a liquid crystal display device of Embodiment 1.
Figure 2:
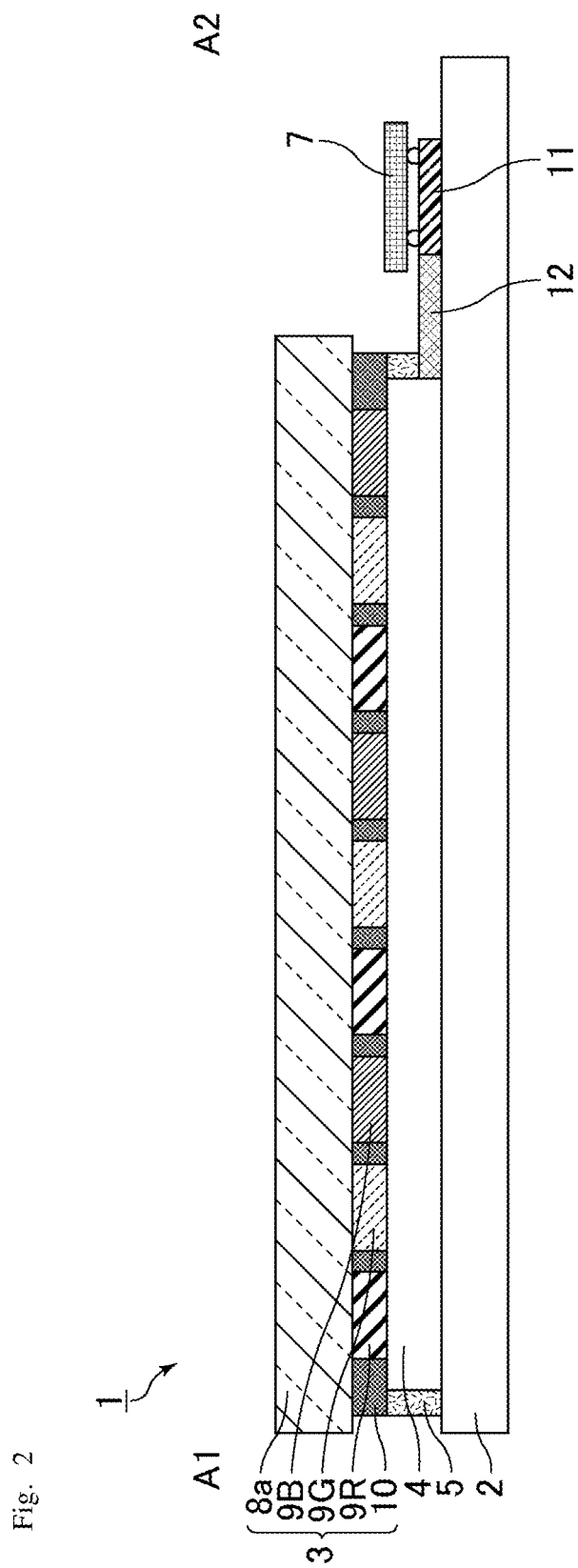
FIG. 2 is a schematic cross-sectional view of a part taken along the line A1-A2 in FIG. 1.

The following describes the structure of a liquid crystal display device of Embodiment 1 with reference to FIGS. 1 and 2. FIG. 1 is a schematic perspective view of a liquid crystal display device of Embodiment 1. FIG. 2 is a schematic cross-sectional view of a part taken along the line A1-A2 in FIG. 1.

A liquid crystal display device 1 includes a thin-film transistor array substrate 2, a color filter substrate 3, a liquid crystal layer 4, and a sealant 5. The thin-film transistor array substrate 2 and the color filter substrate 3 face each other and are bonded together using the sealant 5 with the liquid crystal layer 4 in between. The liquid crystal layer 4 is disposed in a space surrounded by the thin-film transistor array substrate 2, the color filter substrate 3, and the sealant 5.

<Color Filter Substrate>

As shown in FIG. 2, the color filter substrate 3 includes a support 8a and color filter layers 9R (red), 9G (green), and 9B (blue), and a black matrix 10, all disposed on the liquid crystal layer 4 side surface of the support 8a. The black matrix 10 may be disposed in a grid pattern so as to partition the color filter layers 9R, 9G, and 9B that correspond to the respective pixels.

Examples of the material of the support 8a include glass and a resin material such as polyimide.

Examples of the material of the color filter layers 9R, 9G, and 9B include pigment-dispersed color resist. The color combination of the color filter layers is not particularly limited. Examples thereof include a combination of red, green, and blue as shown in FIG. 2 and a combination of red, green, blue, and yellow.

Examples of the material of the black matrix 10 include black resist.

The color filter substrate 3 may further include an alignment film on the liquid crystal layer 4 side surface.

<Liquid Crystal Layer>

The material of the liquid crystal layer 4 may be a positive liquid crystal material having a positive anisotropy of dielectric constant or a negative liquid crystal material having a negative anisotropy of dielectric constant.

<Sealant>

Examples of the sealant 5 include those containing resin such as epoxy resin and (meth) acrylic resin. The sealant 5 may appropriately contain components such as inorganic filler, organic filler, and a curing agent. The sealant 5 may be one cured by UV light (UV-curable sealant), by heat (heat-curable resin), or by both UV light and heat (UV light/heat-curable sealant).

<Thin-Film Transistor Array Substrate>

The thin-film transistor array substrate 2 includes thin-film transistor elements (not shown in FIGS. 1 and 2) in a pixel region PR, and terminals 11 and lead lines 12 extending from the terminals 11 in a terminal region TR. In the present embodiment, the pixel region PR of the thin-film transistor array substrate 2 corresponds to a display region AR that is inside a region surrounded by the sealant 5 and contributes to image display in the liquid crystal display device 1. The terminal region TR is included in a frame region FR that is around the display region AR and does not contribute to image display.

The thin-film transistor array substrate 2 includes a gate line control circuit 6 in a region between the pixel region PR (display region AR) and the sealant 5. The gate line control circuit 6 controls signals supplied to gate lines (not shown in FIGS. 1 and 2) in the pixel region PR (display region AR). Meanwhile, a driver semiconductor chip 7 is mounted on the terminal region TR and is electrically connected to the terminals 11. The driver semiconductor chip 7 functions as a source line control circuit for controlling signals supplied to source lines (not shown in FIGS. 1 and 2) in the pixel region PR (display region AR).

The thin-film transistor array substrate 2 may further include an alignment film on the liquid crystal layer 4 side surface.

Figure 3:
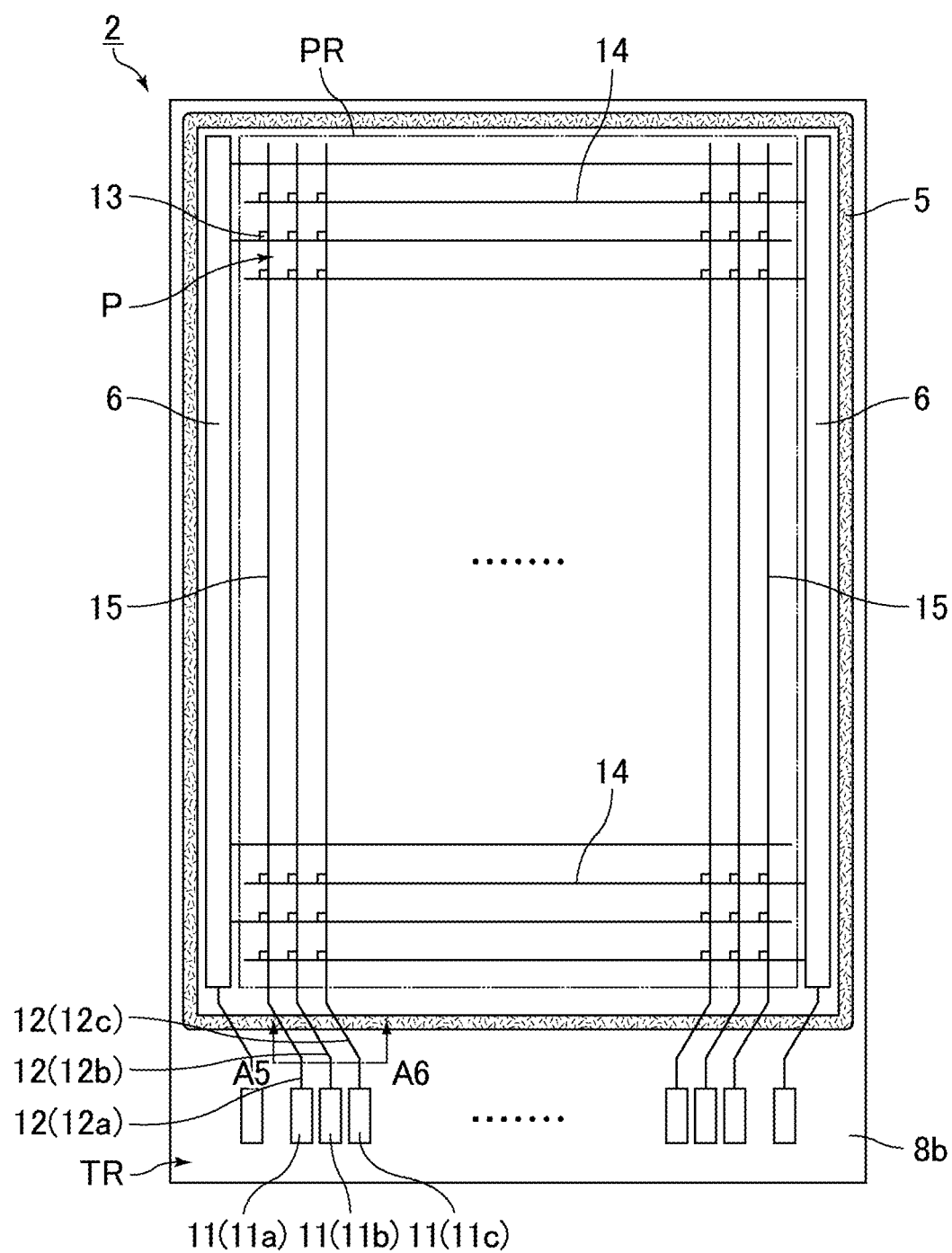
FIG. 3 is a schematic plan view of a thin-film transistor array substrate in FIG. 1.

The thin-film transistor array substrate 2 is specifically described with reference to FIG. 3. FIG. 3 is a schematic plan view of a thin-film transistor array substrate in FIG. 1.

The thin-film transistor array substrate 2 includes a support 8b and various lines and elements disposed on the surface of the support 8b. FIG. 3 shows the sealant 5 in order to clearly illustrate the relation between FIG. 3 and FIGS. 1 and 2.

(Pixel Region)

As shown in FIG. 3, the pixel region PR includes the thin-film transistor elements 13, gate lines 14, and source lines 15. The gate lines 14 and the source lines 15 intersect each other. FIG. 3 shows an example where these lines intersect perpendicularly with each other. The regions defined by the gate lines 14 and the source lines 15 correspond to pixels P. In FIG. 3, the pixel region PR corresponds to a region where the pixels P are arranged in matrix.

Figure 4:
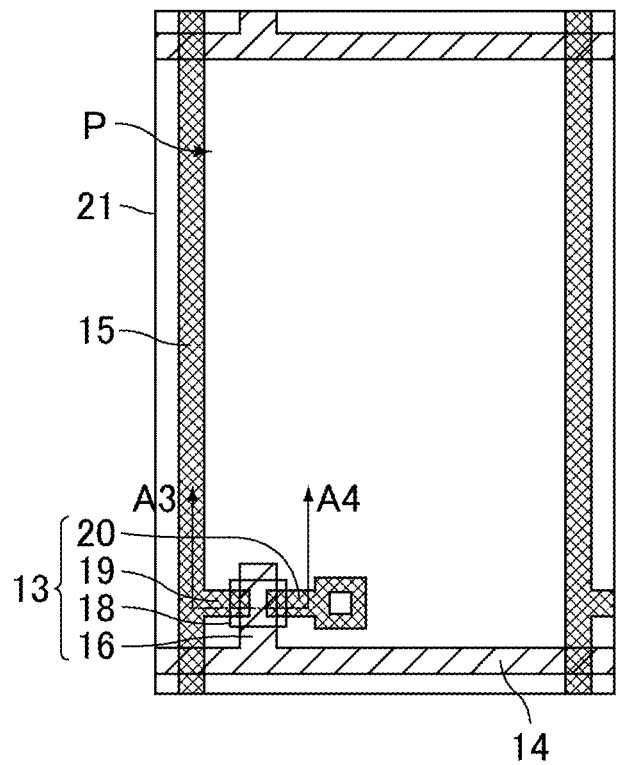
FIG. 4 is an enlarged schematic view of one pixel in FIG. 3.
Figure 5:
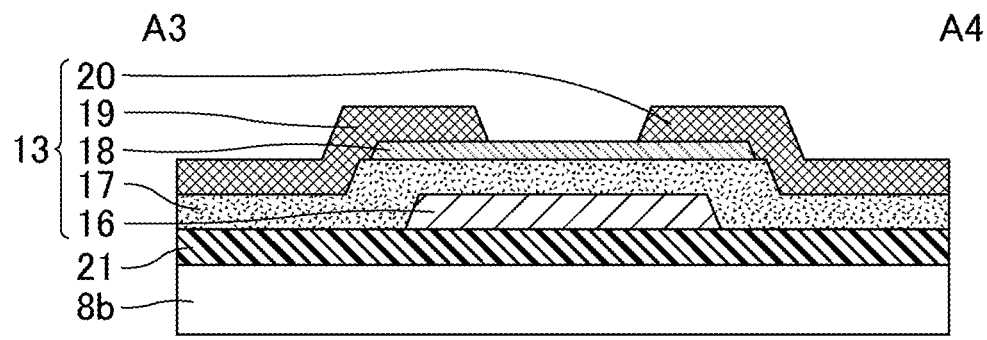
FIG. 5 is a schematic cross-sectional view of apart taken along the line A3-A4 in FIG. 4.

The following specifically describe the pixels P with reference to FIGS. 4 and 5. FIG. 4 is an enlarged schematic view of one pixel in FIG. 3. FIG. 5 is a schematic cross-sectional view of a part taken along the line A3-A4 in FIG. 4.

Each thin-film transistor element 13 includes a gate electrode 16, a gate insulating layer 17, a semiconductor layer 18, a source electrode 19, and a drain electrode 20. As shown in FIG. 4, the thin-film transistor element 13 is disposed in the vicinity of the intersection of the gate line 14 and the source line 15 in each pixel P. In the thin-film transistor element 13, the gate electrode 16 is integrated with the gate line 14, and the source electrode 19 is integrated with the source line 15. In other words, the thin-film transistor element 13 is electrically connected to the gate line 14 and the source line 15.

In a cross-sectional view of the pixel region PR (pixel P) as shown in FIG. 5, the support 8b, a first insulating layer 21, the gate electrode 16, the gate insulating layer 17, and the semiconductor layer 18 are sequentially disposed. The first insulating layer 21 is disposed on a surface of the support 8b and in contact with the support 8b. The gate electrode 16 is disposed on the surface remote from the support 8b of the first insulating layer 21 and is covered with the gate insulating layer 17. The semiconductor layer 18 is disposed on the surface remote from the support 8b of the gate insulating layer 17. An end of the semiconductor layer 18 is covered with and electrically connected to the source electrode 19, and the other end of the semiconductor layer 18 is covered with and electrically connected to the drain electrode 20. In a plan view of the pixel region PR (pixel P) as shown in FIG. 4, the region with the first insulating layer 21 encompasses the region with the semiconductor layer 18. In order to prevent the surface of the semiconductor layer 18 from having a large level difference, the first insulating layer 21 is preferably disposed in the entire surface of the pixel region PR as shown in FIG. 4.

Examples of the material of the support 8b include glass and a resin material such as polyimide.

The first insulating layer 21 is formed from a first insulating material. Examples of the first insulating material include inorganic materials such as silicon oxide and silicon nitride. The first insulating layer 21 may have a single layer structure including one kind of insulating material or a laminate structure including multiple kinds of insulating materials.

The gate line 14 and the gate electrode 16 are formed from a second conductive material. Examples of the second conductive material include metal materials such as aluminum, copper, titanium, molybdenum, and chromium. The gate line 14 and the gate electrode 16 may each have a single layer structure including one conductive material or a laminate structure including multiple conductive materials.

The source line 15, the source electrode 19, and the drain electrode 20 are formed from a third conductive material. Examples of the third conductive material include metal materials such as aluminum, copper, titanium, molybdenum, and chromium. The source line 15, the source electrode 19, and the drain electrode 20 may each have a single layer structure including one conductive material or a laminate structure including multiple conductive materials.

The gate insulating layer 17 is formed from a second insulating material. Examples of the second insulating material include inorganic materials such as silicon oxide and silicon nitride. The gate insulating layer 17 may have a single layer structure including one kind of insulating material or a laminate structure including multiple kinds of insulating materials.

Examples of the material of the semiconductor layer 18 include amorphous silicon, polycrystalline silicon, and an oxide semiconductor. Among these, the oxide semiconductor is preferred because low power consumption and high-speed driving are achieved. The oxide semiconductor can achieve low power consumption because it provides a small amount of off-leakage current (leakage current when the thin-film transistor element 13 is turned off), and can achieve high-speed driving because it provides a large amount of on-current (current when the thin-film transistor element 13 is turned on). Examples of the oxide semiconductor include a compound formed from indium, gallium, zinc, and oxygen and a compound formed from indium, tin, zinc, and oxygen.

The pixel region PR (pixel P) may further include a passivation layer that covers the thin-film transistor element 13. The pixel region PR may still further include pixel electrodes electrically connected to the drain electrodes 20 through apertures formed in the passivation layer.

(Terminal Region)

As shown in FIG. 3, the terminal region TR includes the terminals 11 and lead lines 12 extending from the terminals 11. FIG. 3 shows the case where the terminals 11 include a first terminal 11a, a second terminal 11b, and a third terminal 11c and the lead lines 12 include a first lead line 12a, a second lead line 12b, and a third lead line 12c. The first lead line 12a extends from the first terminal 11a, the second lead line 12b extends from the second terminal 11b, and the third lead line 12c extends from the third terminal 11c. The first lead line 12a, the second lead line 12b, and the third lead line 12c are separately and electrically connected to different source lines 15.

Figure 6:
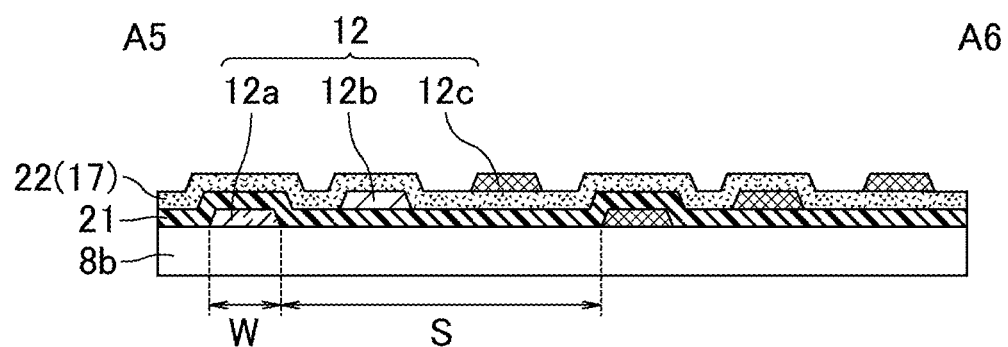
FIG. 6 is a schematic cross-sectional view of apart taken along the line A5-A6 in FIG. 3.

The following specifically describes the region with the lead lines 12 with reference to FIG. 6. FIG. 6 is a schematic cross-sectional view of a part taken along the line A5-A6 in FIG. 3.

In a cross-sectional view of the terminal region TR as shown in FIG. 6, the support 8b, the first lead line 12a, the first insulating layer 21, the second lead line 12b, the second insulating layer 22, and the third lead line 12c are sequentially disposed. The first lead line 12a is disposed on a surface of the support 8b and in contact with the support 8b. The first lead line 12a is covered with the first insulating layer 21. The second lead line 12b is disposed on the surface remote from the support 8b of the first insulating layer 21 and is covered with the second insulating layer 22. The third lead line 12c is disposed on the surface remote from the support 8b of the second insulating layer 22.

The first lead line 12a is formed from a first conductive material. Examples of the first conductive material include metal materials such as aluminum, copper, titanium, molybdenum, and chromium. The first lead line 12a may have a single layer structure including one conductive material or a laminate structure including multiple conductive materials.

The second lead line 12b is formed from the second conductive material of the gate lines 14 and the gate electrodes 16. The second lead line 12b may have a single layer structure including one conductive material or a laminate structure including multiple conductive materials.

The third lead line 12c is formed from the third conductive material of the source lines 15, the source electrodes 19, and the drain electrodes 20. The third lead line 12c may have a single layer structure including one conductive material or a laminate structure including multiple conductive materials.

The second insulating layer 22 is formed from the second insulating material of the gate insulating layer 17. The second insulating layer 22 may have a single layer structure including one kind of insulating material or a laminate structure including multiple kinds of insulating materials.

The terminal region TR may further include a passivation layer that is formed from the material of the passivation layer covering the thin-film transistor elements 13 and covers the third lead line 12c. The terminal region TR may further include, on the surface of the passivation layer, a conductive layer that is formed from the material of the pixel electrodes, which are electrically connected to the drain electrodes 20 of the thin-film transistor elements 13.

Figure 7:
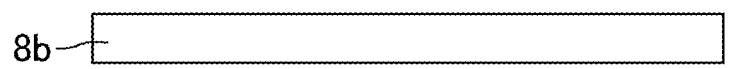
FIG. 7 includes schematic cross-sectional views (Steps a to f) illustrating a method for producing the thin-film transistor array substrate of Embodiment 1, showing a region for forming a thin-film transistor element.
Figure 7:
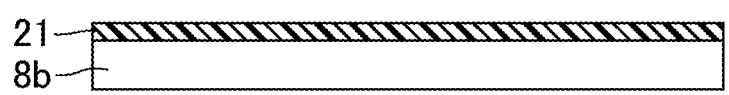
Figure 7:
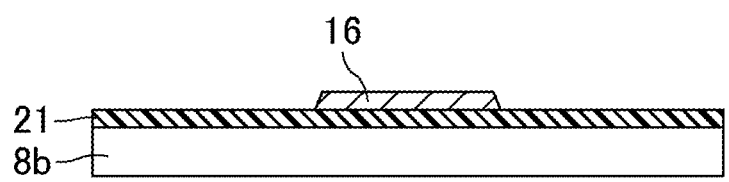
Figure 7:
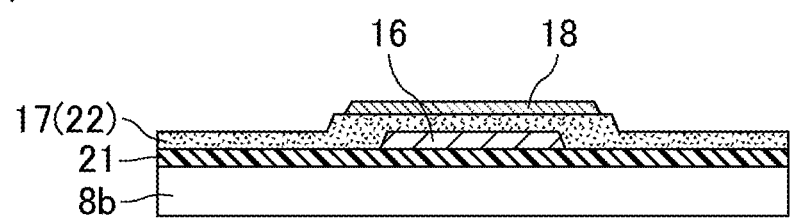
Figure 7:
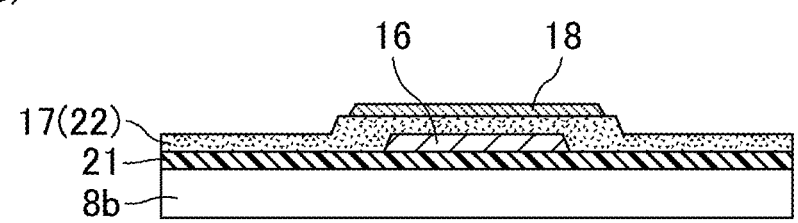
Figure 7:
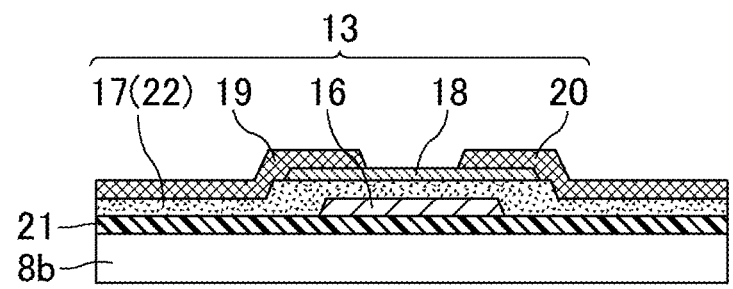
Figure 8:
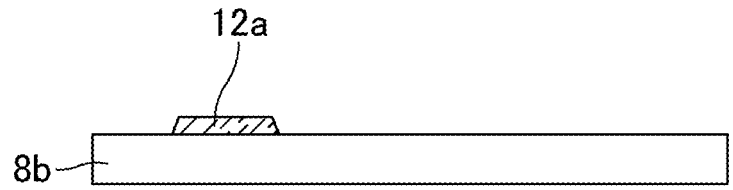
FIG. 8 includes schematic cross-sectional views (Steps a to f) illustrating the method for producing the thin-film transistor array substrate of Embodiment 1, showing a region for forming lead lines.
Figure 8:
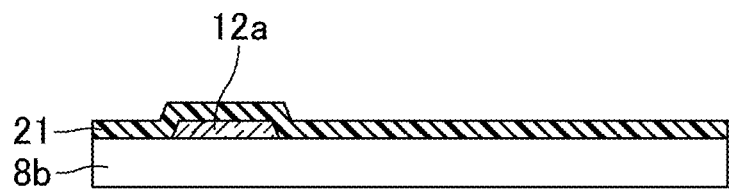
Figure 8:
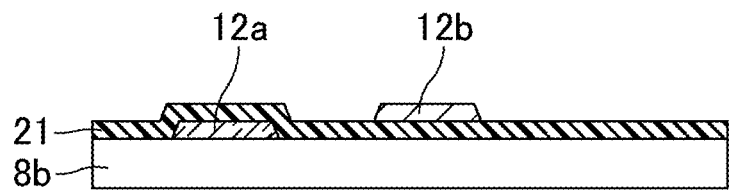
Figure 8:
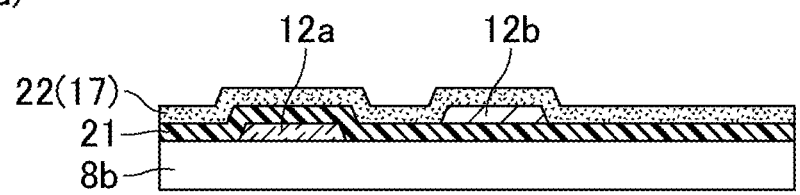
Figure 8:
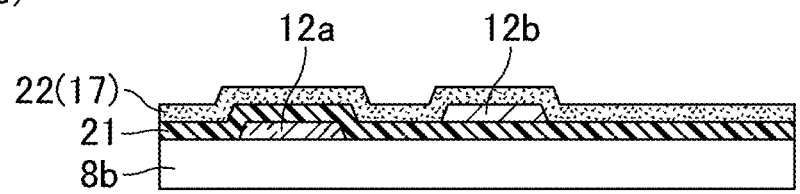
Figure 8:
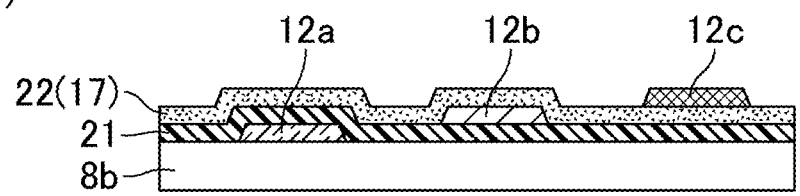
Figure 9:
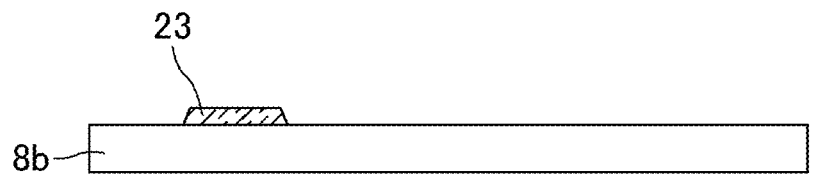
FIG. 9 includes schematic cross-sectional views (Steps a to f) illustrating the method for producing the thin-film transistor array substrate of Embodiment 1, showing a region for forming terminals.
Figure 9:
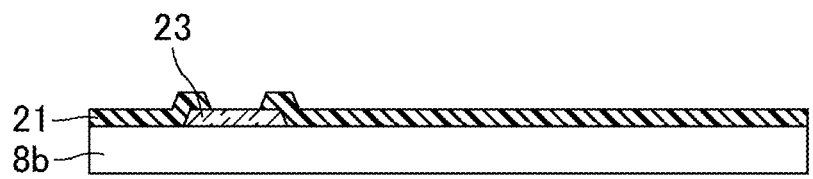
Figure 9:
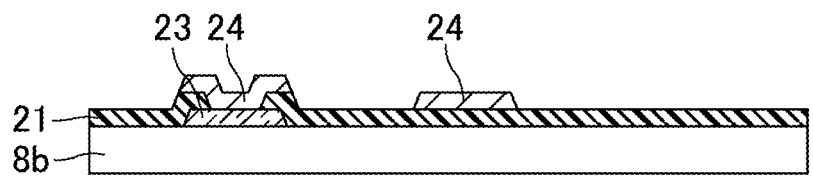
Figure 9:
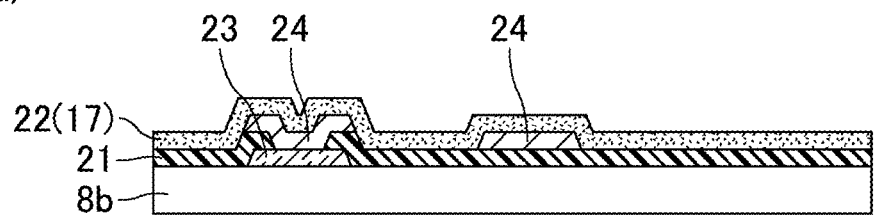
Figure 9:
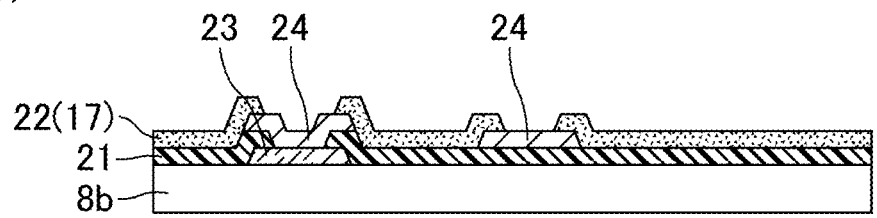
Figure 9:
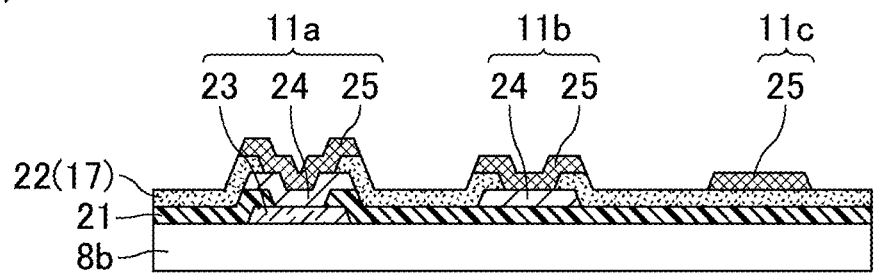

The following describes a method for producing the thin-film transistor array substrate 2 with reference to FIGS. 7 to 9. FIG. 7 includes schematic cross-sectional views (Steps a to f) illustrating a method for producing a thin-film transistor array substrate of Embodiment 1, showing a region for forming a thin-film transistor element. FIG. 8 includes schematic cross-sectional views (Steps a to f) illustrating the method for producing a thin-film transistor array substrate of Embodiment 1, showing a region for forming lead lines. FIG. 9 includes schematic cross-sectional views (Steps a to f) illustrating the method for producing a thin-film transistor array substrate of Embodiment 1, showing a region for forming terminals.

(Step a)

First, a film of the first conductive material is formed on a surface of the support 8b by a method such as sputtering, and the film is patterned by photolithography. Thereby, in the region for forming lead lines, the first lead line 12a is formed in contact with the support 8b as shown in FIG. 8(a). In the region for forming terminals, a first conductive pattern portion 23 is formed in contact with the support 8b as shown in FIG. 9(a). In the region for forming a thin-film transistor element, no layer of the first conductive material remains as shown in FIG. 7(a).

(Step b)

A film of the first insulating material is formed by a method such as chemical vapor deposition (CVD). Thereby, in the region for forming a thin-film transistor element, the first insulating layer 21 is formed in contact with the support 8b as shown in FIG. 7(b). In the region for forming lead lines, the first insulating layer 21 is formed so as to cover the first lead line 12a as shown in FIG. 8(b). In the region for forming terminals, the first insulating layer 21 is formed so as to cover the first conductive pattern portion 23. Then, in the region for forming terminals, the first insulating layer 21 in a part superimposed with the first conductive pattern portion 23 is partly removed to form an aperture as shown in FIG. 9(b).

(Step c)

A film of the second conductive material is formed by a method such as sputtering, and the film is patterned by photolithography. Thereby, in the region for forming a thin-film transistor element, the gate electrode 16 (gate line 14: not shown) is formed on the surface remote from the support 8b of the first insulating layer 21 as shown in FIG. 7(c). In the region for forming lead lines, the second lead line 12b is formed on the surface remote from the support 8b of the first insulating layer 21 as shown in FIG. 8(c). In the region for forming terminals, second conductive pattern portions 24 are formed as shown in FIG. 9(c).

(Step d)

A film of the second insulating material is formed by a method such as chemical vapor deposition (CVD). Thereby, in the region for forming a thin-film transistor element, the gate insulating layer 17 is formed so as to cover the gate electrode 16 as shown in FIG. 7(d). Then, in the region for forming a thin-film transistor element, a film of the material of the semiconductor layer is formed on the surface remote from the support 8b of the gate insulating layer 17 by a method such as sputtering, and the film is patterned by photolithography. Thereby, in the region for forming a thin-film transistor element, the semiconductor layer 18 is formed. In the region for forming lead lines, the second insulating layer 22 is formed so as to cover the second lead line 12b as shown in FIG. 8(d). In the region for forming terminals, the second insulating layer 22 is formed so as to cover the second conductive pattern portions 24 as shown in FIG. 9(d).

(Step e)

In the region for forming terminals, the second insulating layer 22 in parts superimposed with the second conductive pattern portions 24 is partly removed to form apertures as shown in FIG. 9(e). The region for forming a thin-film transistor element and the region for forming lead lines are not subject to any treatment as shown in FIG. 7(e) and FIG. 8(e).

(Step f)

A film of the third conductive material is formed by a method such as sputtering, and the film is patterned by photolithography. Thereby, in the region for forming a thin-film transistor element, the source electrode 19 (source line 15: not shown) is formed so as to cover one end of the semiconductor layer 18, and the drain electrode 20 is formed so as to cover the other end of the semiconductor layer 18, as shown in FIG. 7(f). In the region for forming lead lines, the third lead line 12c is formed on the surface remote from the support 8b of the second insulating layer 22 as shown in FIG. 8(f). In the region for forming terminals, third conductive pattern portions 25 are formed as shown in FIG. 9(f).

Through these steps, in the region for forming a thin-film transistor element, the thin-film transistor element 13 is formed as shown in FIG. 7(f). In the region for forming lead lines, the first lead line 12a, the second lead line 12b, and the third lead line 12c are formed as shown in FIG. 8(f). In the region for forming terminals, the first terminal 11a formed from the first conductive pattern portion 23, one of the second conductive pattern portions 24, and one of the third conductive pattern portions 25, the second terminal 11b formed from one of the second conductive pattern portions 24 and one of the third conductive pattern portions 25, and the third terminal 11c formed from one of the third conductive pattern portions 25 are formed as shown in FIG. 9(f).

The region for forming a thin-film transistor element may further include a passivation layer that covers the thin-film transistor element 13. Furthermore, the passivation layer may be provided with apertures and then the region may further include pixel electrodes on the passivation layer such that the pixel electrodes are electrically connected to the drain electrodes 20 through the apertures.

The region for forming lead lines may further include a passivation layer that is formed from the material of the passivation layer covering the thin-film transistor element 13 and covers the third lead line 12c. On the surface of the passivation layer may be disposed a conductive layer that is formed from the material of the pixel electrodes, which are electrically connected to the drain electrodes 20 of the thin-film transistor elements 13.

The region for forming terminals may further include a passivation layer that is formed from the material of the passivation layer covering the thin-film transistor element 13 and covers the first terminal 11a, the second terminal 11b, and the third terminal 11c. Furthermore, the passivation layer may be provided with apertures and different conductive pattern portions may further be formed so as to be electrically connected to the third conductive pattern portions 25 through the apertures.

In the present embodiment, as shown in FIG. 6 (FIG. 8(f)), the first lead line 12a, the second lead line 12b, and the third lead line 12c as the lead lines 12 are disposed in different layers from each other. Here, the space S between the lead lines 12 disposed in the same layer (in FIG. 6, the first lead lines 12a) and the width W of each lead line are limited due to the production process. Thus, if all the lead lines 12 are arranged in the same layer, the terminal region TR (frame region FR) increases, which inhibits frame reduction. In the present embodiment, as described, the lead lines 12 are disposed separately in three layers. This structure enables disposition of the lead lines 12 at a unit area density three times higher than that in the case where all the lead lines 12 are disposed on the same layer. Accordingly, an increase in the terminal region TR (frame region FR) can be prevented even when the number of the lead lines 12 is increased, which can effectively achieve frame reduction.

In the present embodiment, as shown in FIG. 5 (FIG. 7(f)), in the pixel region PR (display region AR), the first insulating layer 21 is disposed on the lower layer side (support 8b side) of the gate electrode 16 without being removed. Furthermore, as shown in FIG. 4, in a plan view of the pixel region PR (display region AR), the region with the first insulating layer 21 encompasses the region with the semiconductor layer 18. This structure prevents the surface of the semiconductor layer 18 from having a large level difference due to the presence of the first insulating layer 21, and prevents the semiconductor layer 18 from having step disconnection that is caused in the case where the first insulating layer 21 is removed by a method such as dry etching.

As described above, the present embodiment can achieve the thin-film transistor array substrate 2 that prevents the semiconductor layers 18 of the thin-film transistor elements 13 from having step disconnection even when the frame width is reduced, and the liquid crystal display device 1 including the thin-film transistor array substrate 2.

In the present embodiment, as shown in FIG. 5 (FIG. 7(f)), the first insulating layer 21 is disposed between the support 8b and the gate electrode 16. Thus, when a resin material such as polyimide is used as the material of the support 8b, for example, the reaction between impurities in the support 8b and the second conductive material of the gate electrode 16 is prevented. As a result, defects such as property change of the thin-film transistor element 13 and peeling of the gate electrode 16 can be prevented. In other words, the first insulating layer 21 can also function as a barrier layer for the gate electrodes 16 (thin-film transistor element 13) to the support 8b.

Embodiment 2

Figure 10:
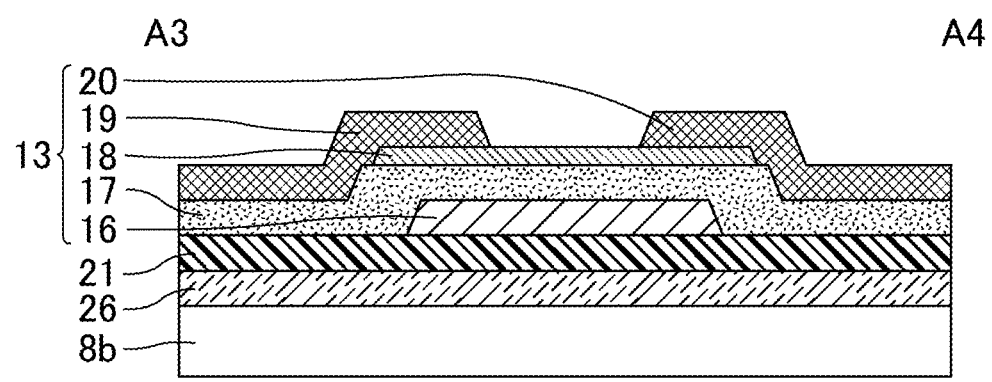
FIG. 10 is a schematic cross-sectional view of apart taken along the line A3-A4 in FIG. 4, showing a different structure from that in FIG. 5.

The following describes the structure of a liquid crystal display device of Embodiment 2 with reference to FIG. 10. FIG. 10 is a schematic cross-sectional view of a part taken along the line A3-A4 in FIG. 4, showing a different structure from that in FIG. 5. The liquid crystal display device of Embodiment 2 is the same as the liquid crystal display device of Embodiment 1 except for further including a conductive layer that is in contact with the support in the pixel region (display region). Thus, descriptions of the same features are omitted as appropriate.

In a cross-sectional view of the pixel region PR (pixel P) as shown in FIG. 10, the support 8b, a conductive layer 26, the first insulating layer 21, the gate electrode 16, the gate insulating layer 17, and the semiconductor layer 18 are sequentially disposed. The conductive layer 26 is disposed on a surface of the support 8b and in contact with the support 8b. The first insulating layer 21 is disposed on a surface of the conductive layer 26. The gate electrode 16 is disposed on the surface remote from the support 8b of the first insulating layer 21 and is covered with the gate insulating layer 17. The semiconductor layer 18 is disposed on the surface remote from the support 8b of the gate insulating layer 17. An end of the semiconductor layer 18 is covered with and electrically connected to the source electrode 19, and the other end of the semiconductor layer 18 is covered with and electrically connected to the drain electrode 20.

The conductive layer 26 is formed from the first conductive material of the first lead line 12a. The conductive layer 26 may have a single layer structure including one conductive material or a laminate structure including multiple conductive materials.

Figure 11:
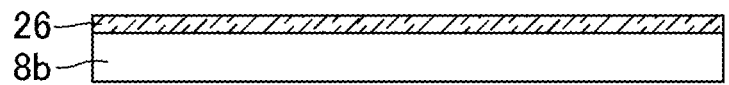
FIG. 11 includes schematic cross-sectional views (Steps a to f) illustrating a method for producing a thin-film transistor array substrate of Embodiment 2, showing a region for forming a thin-film transistor element.
Figure 11:
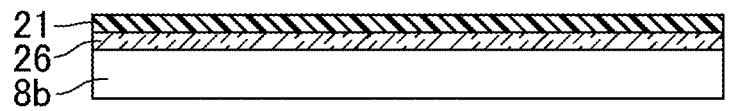
Figure 11:
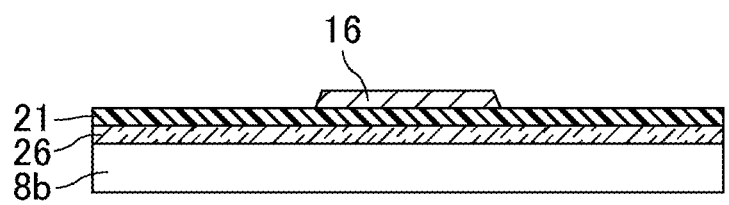
Figure 11:
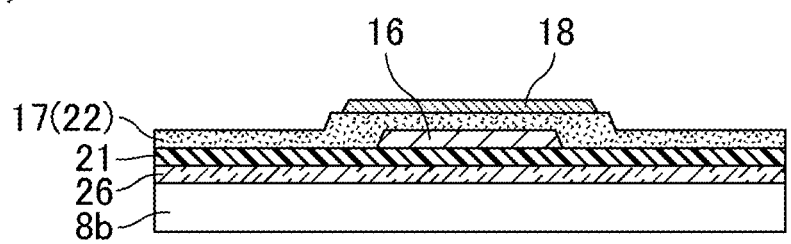
Figure 11:
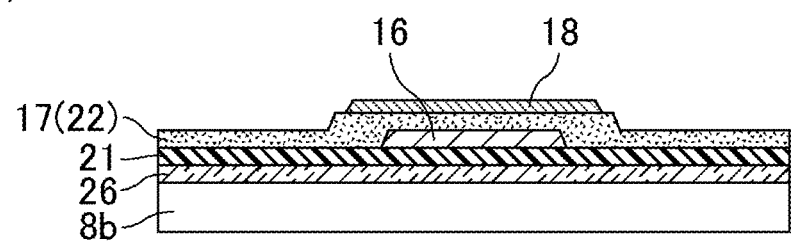
Figure 11:
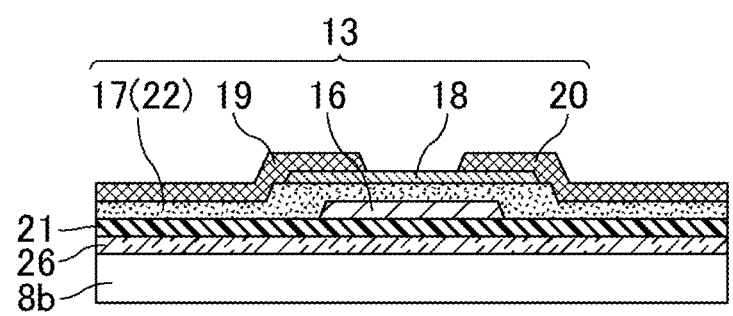
Figure 12:
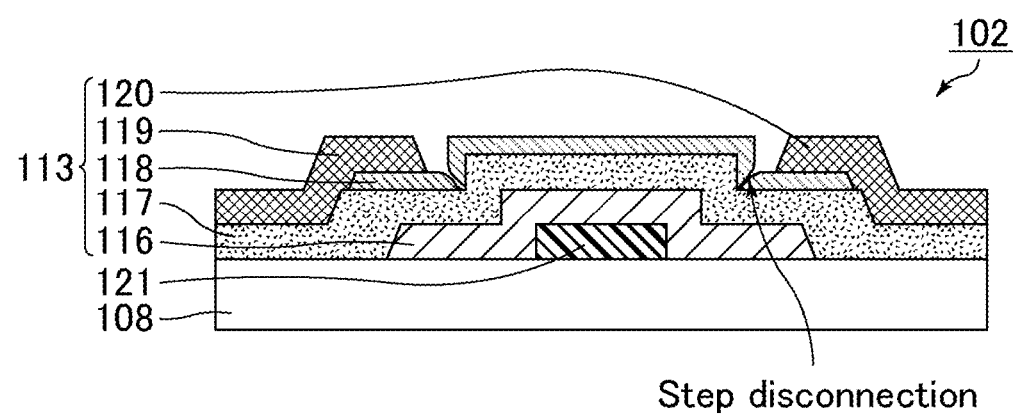
FIG. 12 is a schematic cross-sectional view illustrating a state of step disconnection of a semiconductor layer.

The following describes a method for producing the thin-film transistor array substrate 2 with reference to FIG. 11. FIG. 11 includes schematic cross-sectional views (Steps a to f) illustrating a method for producing a thin-film transistor array substrate of Embodiment 2, showing a region for forming a thin-film transistor element. The method for producing the thin-film transistor array substrate of Embodiment 2 in the regions other than the region for forming a thin-film transistor element, i.e., the region for forming lead lines and the region for forming terminals, is the same as the method for producing a thin-film transistor array substrate of Embodiment 1, which is shown in FIGS. 8 and 9.

(Step a)

First, a film of the first conductive material is formed on a surface of the support 8b by a method such as sputtering, and the film is patterned by photolithography. Thereby, in the region for forming a thin-film transistor element, the conductive layer 26 is formed in contact with the support 8b as shown in FIG. 11(a). In the region for forming lead lines, the first lead line 12a is formed in contact with the support 8b as shown in FIG. 8(a). In the region for forming terminals, the first conductive pattern portion 23 is formed in contact with the support 8b as shown in FIG. 9(a).

(Step b)

A film of the first insulating material is formed by a method such as chemical vapor deposition (CVD). Thereby, in the region for forming a thin-film transistor element, the first insulating layer 21 is formed on the surface remote from the support 8b of the conductive layer 26 as shown in FIG. 11(b). In the region for forming lead lines, the first insulating layer 21 is formed so as to cover the first lead line 12a as shown in FIG. 8(b). In the region for forming terminals, the first insulating layer 21 is formed so as to cover the first conductive pattern portion 23. Then, in the region for forming terminals, the first insulating layer 21 in a part superimposed with the first conductive pattern portion 23 is partly removed to form an aperture as shown in FIG. 9(b).

(Step c)

A film of the second conductive material is formed by a method such as sputtering, and the film is patterned by photolithography. Thereby, in the region for forming a thin-film transistor element, the gate electrode 16 (gate line 14: not shown) is formed on the surface remote from the support 8b of the first insulating layer 21 as shown in FIG. 11(c). In the region for forming lead lines, the second lead line 12b is formed on the surface remote from the support 8b of the first insulating layer 21 as shown in FIG. 8(c). In the region for forming terminals, the second conductive pattern portions 24 are formed as shown in FIG. 9(c).

(Step d)

A film of the second insulating material is formed by a method such as chemical vapor deposition (CVD). Thereby, in the region for forming a thin-film transistor element, the gate insulating layer 17 is formed so as to cover the gate electrode 16 as shown in FIG. 11(d). Then, in the region for forming a thin-film transistor element, a film of the material of the semiconductor layer is formed on the surface remote from the support 8b of the gate insulating layer 17 by a method such as sputtering, and the film is patterned by photolithography. Thereby, in the region for forming a thin-film transistor element, the semiconductor layer 18 is formed. In the region for forming lead lines, the second insulating layer 22 is formed so as to cover the second lead line 12b as shown in FIG. 8(d). In the region for forming terminals, the second insulating layer 22 is formed so as to cover the second conductive pattern portions 24 as shown in FIG. 9(d).

(Step e)

In the region for forming terminals, the second insulating layer 22 in parts superimposed with the second conductive pattern portions 24 is partly removed to form apertures as shown in FIG. 9(e). In the region for forming a thin-film transistor element and in the region for forming lead lines, no treatment is performed as shown in FIG. 11(e) and FIG. 8(e).

(Step f)

A film of the third conductive material is formed by a method such as sputtering, and the film is patterned by photolithography. Thereby, in the region for forming a thin-film transistor element, a source electrode 19 (source line 15: not shown) is formed so as to cover one end of the semiconductor layer 18, and the drain electrode 20 is formed so as to cover the other end of the semiconductor layer 18, as shown in FIG. 11(f). In the region for forming lead lines, the third lead line 12c is formed on the surface remote from the support 8b of the second insulating layer 22 as shown in FIG. 8(f). In the region for forming terminals, the third conductive pattern portions 25 are formed as shown in FIG. 9(f).

Similarly to Embodiment 1, the present embodiment achieves the thin-film transistor array substrate 2 that prevents the semiconductor layers 18 of the thin-film transistor elements 13 from having step disconnection even when the frame width is reduced, and the liquid crystal display device 1 including the thin-film transistor array substrate 2.

In the present embodiment, as shown in FIG. 10 (FIG. 11(f)), the pixel region PR (display region AR) includes the conductive layer 26 that is present between the support 8b and the first insulating layer 21, formed from the first conductive material of the first lead line 12a, and in contact with the support 8b. Differently from signal lines for image display such as the gate lines 14 and the source lines 15, the conductive layer 26 can be used as a signal line for detecting the position touched by a user on the image display screen, i.e., a touch panel line. In this case, in the pixel region PR (display region AR), detecting the change in static capacitance formed between the conductive layer 26 and another conductive layer (e.g., gate electrode 16 (gate line 14)) enables detection of the position touched by a user on the image display screen. Accordingly, the present embodiment can achieve a touch panel called an in-cell touch panel in which touch panel lines are disposed inside the pixel region PR (display region AR).

[Additional Remarks]

An aspect of the present invention may be a thin-film transistor array substrate including a thin-film transistor element in a pixel region and a terminal in a terminal region, the thin-film transistor array substrate sequentially including a support, an insulating layer, a gate electrode, a gate insulating layer, and a semiconductor layer in a cross-sectional view of the pixel region, a region with the insulating layer encompassing a region with the semiconductor layer in a plan view of the pixel region, the thin-film transistor array substrate sequentially including the support, a lead line extending from the terminal, and the insulating layer in a cross-sectional view of the terminal region. This aspect can achieve a thin-film transistor array substrate that prevents the semiconductor layer of the thin-film transistor element from having step disconnection even when the frame width is reduced.

In an embodiment of the present invention, the insulating layer may be in contact with the support in a cross-sectional view of the pixel region, and the lead line may be in contact with the support in a cross-sectional view of the terminal region. With this structure, the reaction between impurities in the support and the material of the gate electrode is prevented. As a result, defects such as property change of the thin-film transistor element and peeling of the gate electrode can be prevented. In other words, the insulating layer can also function as a barrier layer of the gate electrode (the thin-film transistor element) to the support.

In an embodiment of the present invention, the thin-film transistor array substrate may further include, in a cross-sectional view of the pixel region, a conductive layer that is present between the support and the insulating layer, formed from a conductive material of the lead line, and in contact with the support, and the lead line may be in contact with the support in a cross-sectional view of the terminal region. With this structure, when the thin-film transistor array substrate is applied to a display device, the conductive layer can be used as a signal line for detecting the position touched by a user on the image display screen, i.e., a touch panel line. In this case, in the pixel region, detecting the change in static capacitance formed between the conductive layer and another conductive layer (e.g., the gate electrode) enables detection of the position touched by a user on the image display screen. Accordingly, this structure can achieve a touch panel called an in-cell touch panel in which touch panel lines are disposed inside the pixel region Another aspect of the present invention may be a display device including the thin-film transistor array substrate. This aspect can achieve a display device that prevents the semiconductor layer of the thin-film transistor element from having step disconnection even when the frame width is reduced.

In another aspect of the present invention, the display device may be a liquid crystal display device. With this structure, the thin-film transistor array substrate can be applied to a liquid crystal display device. The thin-film transistor array substrate can be applied to any type of the display device, and examples thereof include organic electroluminescent display devices in addition to liquid crystal display devices.

REFERENCE SIGNS LIST

1: Liquid crystal display device
2, 102: Thin-film transistor array substrate
3: Color filter substrate
4: Liquid crystal layer
5: Sealant
6: Gate line control circuit
7: Driver semiconductor chip
8a, 8b, 108: Support
9R, 9G, 9B: Color filter layer
10: Black matrix
11: Terminal
11a: First terminal
11b: Second terminal
11c: Third terminal
12: Lead line
12a: First lead line
12b: Second lead line
12c: Third lead line
13, 113: Thin-film transistor element
14: Gate line
15: Source line
16, 116: Gate electrode
17, 117: Gate insulating layer
18, 118: Semiconductor layer
19, 119: Source electrode
20, 120: Drain electrode
21: First insulating layer
22: Second insulating layer
23: First conductive pattern
24: Second conductive pattern
25: Third conductive pattern
26: Conductive layer
121: Insulating layer
PR: Pixel region
AR: Display region
TR: Terminal region
FR: Frame region
P: Pixel
S: Space between lead lines
W: Width of lead line

The invention claimed is:

1. A thin-film transistor array substrate comprising a thin-film transistor element in a pixel region and a terminal in a terminal region,
the thin-film transistor array substrate sequentially including a support, an insulating layer, a gate electrode, a gate insulating layer, and a semiconductor layer in a cross-sectional view of the pixel region,
a region with the insulating layer encompassing a region with the semiconductor layer in a plan view of the pixel region,
the thin-film transistor array substrate sequentially including the support, a lead line extending from the terminal, and the insulating layer in a cross-sectional view of the terminal region.

2. The thin-film transistor array substrate according to claim 1,
wherein the insulating layer is in contact with the support in a cross-sectional view of the pixel region, and the lead line is in contact with the support in a cross-sectional view of the terminal region.

3. The thin-film transistor array substrate according to claim 1, further comprising, in a cross-sectional view of the pixel region, a conductive layer that is present between the support and the insulating layer, formed from a conductive material of the lead line, and in contact with the support, and the lead line is in contact with the support in a cross-sectional view of the terminal region.

4. A display device comprising the thin-film transistor array substrate according to claim 1.

5. A display device according to claim 4, being a liquid crystal display device.

* * * * *